United States Patent
Lysinger

(10) Patent No.: US 7,218,542 B2
(45) Date of Patent: May 15, 2007

(54) PHYSICAL PRIORITY ENCODER

(75) Inventor: Mark Lysinger, Carrollton, TX (US)

(73) Assignee: STMicroelectronics, Inc., Carrollton, TX (US)

( * ) Notice: Subject to any disclaimer, the term of this patent is extended or adjusted under 35 U.S.C. 154(b) by 89 days.

(21) Appl. No.: 11/134,890

(22) Filed: May 23, 2005

(65) Prior Publication Data

US 2006/0262582 A1 Nov. 23, 2006

(51) Int. Cl.
*G11C 15/00* (2006.01)
*G11C 7/06* (2006.01)
*G11C 7/00* (2006.01)
*G06F 13/00* (2006.01)

(52) U.S. Cl. .................. 365/49; 365/189.07; 365/203; 711/108; 711/128

(58) Field of Classification Search ................ 711/108, 711/128; 365/49
See application file for complete search history.

(56) References Cited

U.S. PATENT DOCUMENTS

| | | | |
|---|---|---|---|
| 6,154,384 A * | 11/2000 | Nataraj et al. ................ | 365/49 |
| 6,678,184 B2 | 1/2004 | Lysinger et al. ............... | 365/49 |
| 6,687,785 B1 | 2/2004 | Pereira ........................ | 711/108 |
| 6,732,227 B1 | 5/2004 | Baumann ..................... | 711/108 |
| 6,792,502 B1 | 9/2004 | Pandya et al. ............... | 711/108 |
| 7,092,311 B1 * | 8/2006 | Proebsting ............. | 365/230.06 |
| 2003/0005146 A1 | 1/2003 | Miller et al. ................. | 709/238 |
| 2004/0012989 A1 | 1/2004 | Park et al. ..................... | 365/49 |
| 2004/0052134 A1 | 3/2004 | Batson et al. ............... | 365/202 |
| 2004/0128437 A1 | 7/2004 | Regev et al. ................ | 711/108 |
| 2004/0128440 A1 | 7/2004 | Regev et al. ................ | 711/108 |

* cited by examiner

*Primary Examiner*—Huan Hoang
*Assistant Examiner*—Ly Duy Pham
(74) *Attorney, Agent, or Firm*—Lisa K. Jorgenson; Christopher F. Regan

(57) ABSTRACT

A priority encoder can be used for a Content-Addressable Memory (CAM) device that typically has an array of CAM cells arranged in columns and rows with each row having a match signal indicative that compare data has matched data within the respective row. A priority encoder is operatively connected to the array of CAM cells and determines a highest priority matching address for data within the array of CAM cells. The priority encoder includes match lines associated with respective rows and precharged bus lines connected into respective match lines that are discharged whenever there is a match signal such that the highest precharged bus line discharged results in an encoded address.

32 Claims, 14 Drawing Sheets

PHYSICAL PRIORITY ENCODER

FIELD OF THE INVENTION

The present invention relates to the Content-Addressable Memory (CAM) devices, more particularly, the present invention relates to a priority encoder used for a Content-Addressable Memory (CAM) device.

BACKGROUND OF THE INVENTION

Content-Addressable Memories (CAMs) use semi-conductor memory components such as Static Random Access Memory (SRAM) circuits and additional comparison circuitry that permits any required searches to be completed in a single clock cycle. Searches using Content-Addressable Memories and associated comparison circuitry are typically faster than algorithmic searches. Because Content-Addressable Memories are faster, they are often used in Internet routers for complicated address look-up functions. They are also used in database accelerators, data compression applications, neural networks, Translation Look-aside Buffers (TLB) and processor caches.

In a Content-Addressable Memory, any data is typically stored randomly in different memory locations, which are selected by an address bus. Data is also typically written directly into a first entry or memory location. Each memory location could have associated with the memory a pair of special status bits that keep track of whether the memory location includes valid data or is empty and available for overriding. Any information stored at a specific memory location is located by comparing every bit in memory with any data placed in a comparand register. A match flag is asserted to allow a user to know that the data is in memory. Priority encoders sort the matching locations by priority and make address matching location available to a user.

As compared to more standard memory address circuits, in a Content-Addressable Memory circuit data is supplied and an address obtained, and thus, address lines are not required. A router address look-up search examines a destination address for incoming packets and the address look-up table to find an appropriate output port. This algorithm and circuitry involves longest-prefix matching and uses the Internet Protocol (IP) networking standard.

Current routing tables have about 30,000 entries or more and the number of entries is increasing growing rapidly. Terabit-class routers perform hundreds of millions of searches per second and update routing tables thousands of times per second. Because of present and future projected routing requirements, Content-Addressable Memories are used to complete a search in a single cycle. In these circuits, comparison circuitry is usually added to every CAM memory cell, forming a parallel look-up engine. The CAM memory cells can be arranged in horizontal words, such as four horizontal words that are each five bits long. The cells contain both storage and comparison circuitry. Search lines run vertically and broadcast search data to the CAM cells. Match lines run horizontally across the array and indicate whether a search data matches the word in the row. An activated match line indicates a match, and a deactivated match line indicates a non-match or mismatch. The match lines are input to the priority encoder which generates an address corresponding to a match location.

Typically, a search will begin by pre-charging high all match lines in a matched state. Data is broadcast by drivers onto search lines. The CAM cells compare the stored bit against a bit on corresponding search lines. Any cells that match data do not affect match lines, but any cells with a mismatch would pull-down a match line for any word that has at least one mismatch. Other match lines without mismatches remain precharged high.

The priority encoder will generate a search address location for any matching data. For example, an encoder could select numerically the smallest numbered match line for two activated match lines and generate a match address, for example 01. This can be input to a RAM that contains output ports. The match address output is a pointer that retrieves associated data from RAM. An SRAM cell could include positive feedback in a back-to-back inverter with two access transistors connecting bit lines to storage nodes under control of a word line. Data is written or read into and from a cell through the bit lines. Mismatches result in discharged match lines and power consumption is the result. There are more mismatches typically than matches.

The circuit can be arrayed to handle a number of binary divisible row locations. A column structure can be hierarchical in nature. In a CAM application, it is sometimes necessary to encode one or more row locations. Because only one location can typically be encoded at a time, the locations are prioritized and the highest priorities are encoded. The priority can be set based on a physical order. CAM devices typically require a physical prioritization. Usually a priority encoder is done with many stages of combinational logic. These priority encoders often use a circuit requiring a large footprint and often limits performance.

SUMMARY OF THE INVENTION

The present invention provides a physical priority encoder that can be used not only for a Content-Addressable Memory (CAM) device, but also for any device requiring many arrayed objects to be encoded in binary. The present invention uses precharged bus lines as dynamic circuits, which result in higher performance in a smaller footprint. When the priority encoder is used with a Content-Addressable Memory (CAM), each row can produce a match signal indicating that compare data is matched to the row data. A 2-bit encoder is set forth in one embodiment, and another 4-bit priority encoder is set forth in yet another embodiment and built using the 2-bit encoder footprint. Additional arrayed blocks can be added to provide a precharged bus line and convert bus priorities to usable binary addresses. Address conversion can be done on each 2-bit encoder using address conversion.

In one aspect of the present invention, a Content-Addressable Memory (CAM) device includes an array of Cam cells arranged in columns and rows. Each row has a match signal indicative that compare data has matched data within the respective row. A priority encoder is operatively connected to the array of CAM cells and determines a highest priority matching address for data within the array of CAM cells. The priority encoder includes match lines associated with respective rows and precharged bus lines connected into respective match lines that are discharged whenever there is a match signal such that the highest precharged bus line discharge results in an encoded address.

In another aspect of the invention, the priority encoder includes a plurality of n-bit encoder circuits that are cascaded together to accommodate the number of address bits as necessary for the array of CAM cells. Carry signals on a most significant n-bit encoder circuit feed match lines on less significant cascaded n-bit encoder circuits. A logic circuit can be used for inhibiting a carry operation or allowing a carry operation to the next cascaded encoder circuit. The logic can be formed as a second logic component, and an inverter circuit coupled to the second logic component. The second logic component can be formed as an inverter or NAND gate.

In another aspect of the present invention, the n-bit encoder circuit can be formed as a 2-bit encoder circuit having four rows. Precharged bus lines can be charged high at the beginning of an encoding cycle. Each match line can be formed as a pull-down transistor that discharges a precharged bus line when a match signal on a match line is high. Each pull-down transistor can also be formed as a gate connected to a respective match line, a source connected to ground, and a drain connected to a respective precharged bus line. Match lines can also be ordered in priority of bit addresses with the most significant bit addresses followed by least significant bit addresses. A precharge circuit can also be operatively connected to the precharged bus lines for charging the precharged bus lines high at the beginning of an encoding cycle. Each precharge circuit can comprise a transistor that pulls each precharged bus line to VDD at the beginning of an encoding cycle.

BRIEF DESCRIPTION OF THE DRAWINGS

Other objects, features and advantages of the present invention will become apparent from the detailed description of the invention which follows, when considered in light of the accompanying drawings in which.

DETAILED DESCRIPTION OF THE PREFERRED EMBODIMENTS

The present invention will now be described more fully hereinafter with reference to the accompanying drawings, in which preferred embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like numbers refer to like elements throughout, and prime notation is used to indicate similar elements in alternative embodiments.

Figure 1:
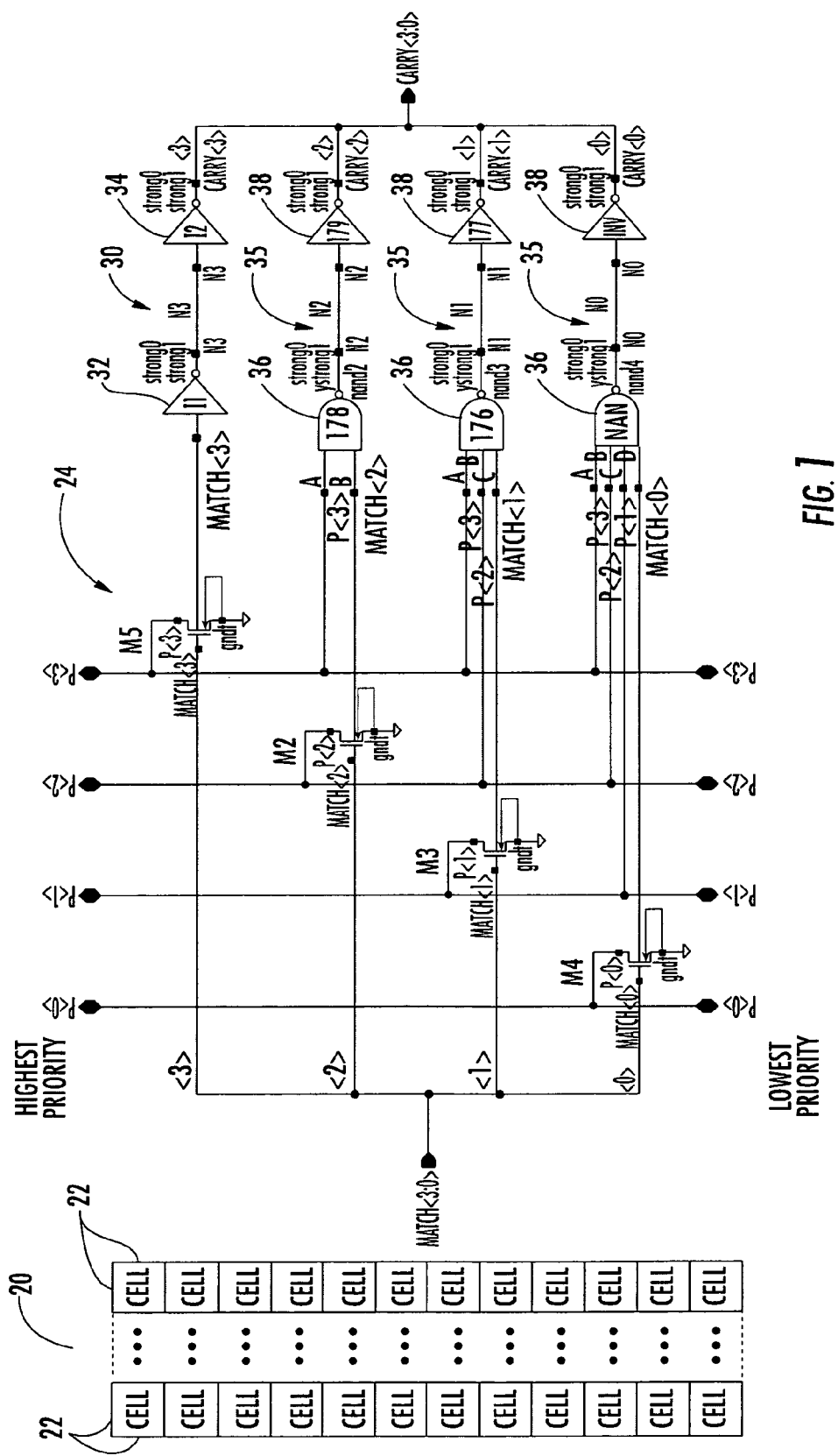
FIG. 1 is a schematic circuit diagram of the priority encoder of the present invention as a 2-bit encoder circuit four row by four column physical priority encoder with combinational logic.

Referring to FIG. 1, there is illustrated a schematic circuit diagram of a Content-Addressable Memory (CAM) device 20 that includes an array of CAM cells 22 arranged in columns and rows and adapted for use with a physical priority encoder. The priority encoder 24 is connected to the array of CAM cells for determining a highest priority address for data within the cam cells. The priority encoder 24 includes match lines and precharged bus lines connected into respective match lines that are discharged wherever there is a match such that the highest precharged bus line, which is discharged results in an encoded address. The illustrated priority encoder 24 as illustrated is a 2-bit encoder circuit formed as a four row by four column physical priority encoder with combinational logic. The priority encoder 24 includes transistor M5 operative with the precharged bus line P<3> as illustrated. This transistor M5 connects to a respective logic circuit 30, formed in this example as inverter-inverter circuit having two serially connected inverters 32, 34. Three other transistors (M2–M4) connect to respective precharged bus lines P<0>, P<1>, and P<2> and match line <0>, <1>, and <2>, as well as logic circuit 35, for example, parallel connected NAND gates 36, each followed by an inverter circuit 38 and connected to the respective match lines and precharged bus lines as illustrated. Each transistor can be formed as an n-channel transistor.

The logic circuit 35 is an inverter circuit 38 connected to a second logic component, for example the NAND gate 36 or inverter 32 as in the case of the highest priority match line illustrated. Transistor M4 connected to match line <0> and precharged bus line P<0> is not required except on the least significant digit. A carry logic section is not required in the least significant section of the priority encoder. In binary terms the priority encoder circuit forms a 2-bit by 2-bit priority encoder. Each of the two bits has two possible states and represents four possibilities. Physically the top row as match line <3> is considered the highest priority and the bottom row as match line <0> is considered the lowest priority.

It is possible to use this approach with a three bit or more encoder, including 8, 16, 32 and higher bit encoders. A 2-bit encoder circuit is illustrated in this non-limiting example because it represents a more simple approach from a performance and size perspective. Larger bit widths can be handled by cascading 2-bit encoder circuits.

The priority encoder 24 as described is especially applicable for use in a Content-Addressable Memory (CAM). Each row has a match signal indicating that compare data can match the row data. Details of conventional matching function and operation is not set forth in detail, but is understood by those skilled in the art. It is assumed, however, that when a match signal is asserted, a match has occurred on that row. Any number of rows can have a match in any given clock cycle and that match is registered allowing it to be encoded during the following cycle. For example, in this described example, it is assumed that the four "MATCH<3:0>" signals have been registered and are ready for encoding.

This 2-bit encoder circuit 24 can have a dual role in accordance with the present invention. First, the encoder circuit can determine what highest physical location is matched. Second, the encoder circuit can inhibit or allow a carry to lower significant 2-bit addresses when multiple encoder circuits are cascaded together. For example, if a 4-bit encoder is required, then two, 2-bit encoder circuits 24 of the type shown in FIG. 1 are cascaded. The carry signals on the first most significant 2-bit encoder circuit would feed the matched signals on the second and less significant 2-bit encoder circuit. An example of a 4-bit priority encoder that can be formed by cascading 2-bit priority encoder circuits is shown in the expanded level block diagram in FIG. 2 at 40. Match <0> through Match <15> indicates 16 match lines and P<0> through P<6> indicates the 7 precharged bus lines. All Match lines and precharged bus lines are shown.

Figure 2:
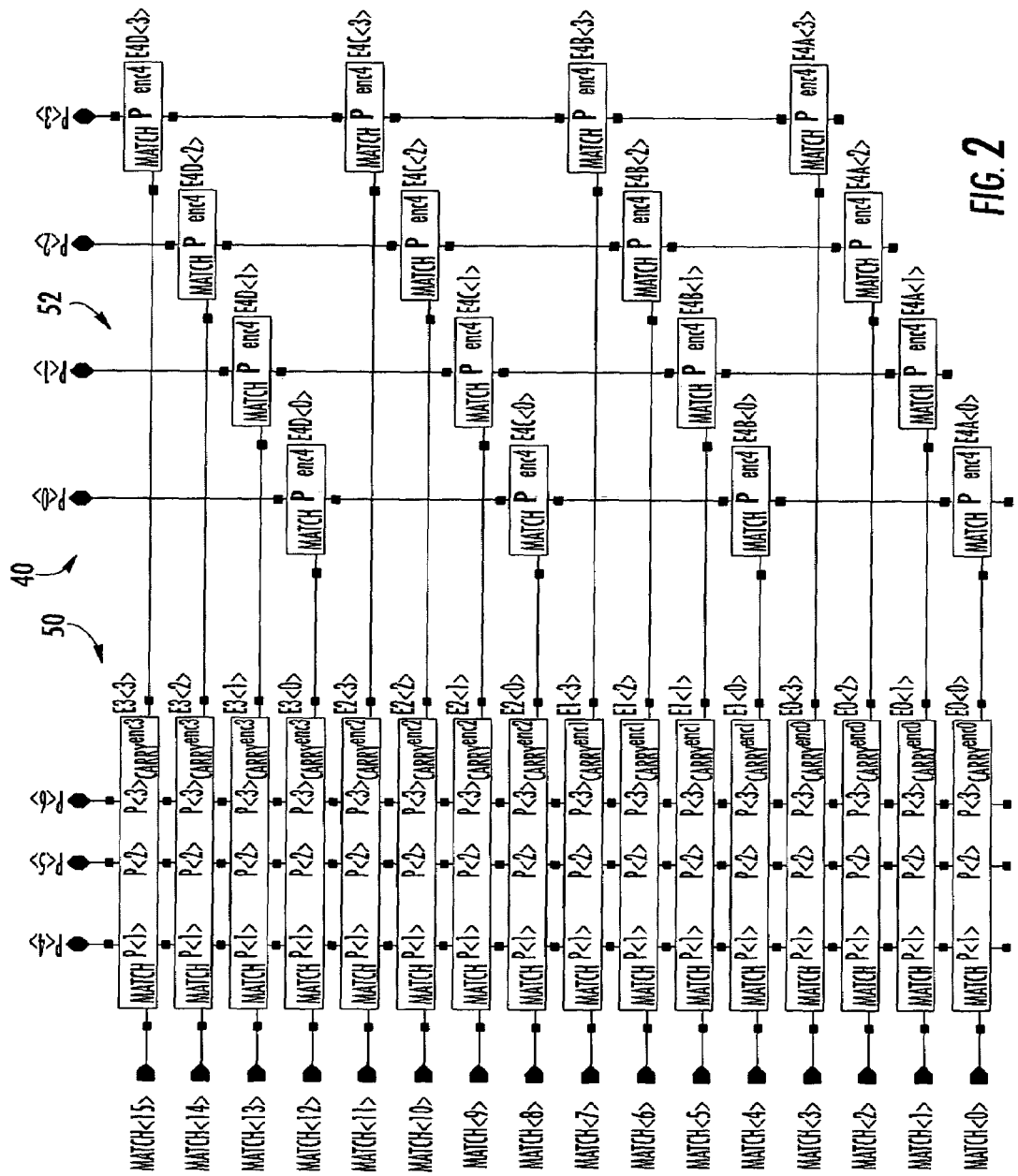
FIG. 2 is an expanded block diagram of a 4-bit priority encoder in one nonlimiting example of the invention.

This illustrated circuit, such as shown in FIGS. 1 and 2, as a first task determines the highest matched physical location. As illustrated in FIG. 1, each "MATCH<3:0>" line connects to the gate of its respective n-channel transistor. The source of each transistor is grounded, and its drain is connected to a corresponding precharged bus line P<3:0>. At the beginning of the encoding cycle all precharged bus lines will be charged to VDD (high voltage supply). After an appropriate settling time, the matched signals will be applied to the gates of the transistors. Wherever there is a match (high state), a precharged bus line will be discharged to ground. The highest P bus line discharged will be the resulting encoded address.

As a second task, this circuit provides carried, matched information to another 2-bit encoder circuit in a cascaded fashion. The NAND gates and inverters provide logic to inhibit or allow the carry.

If the top row MATCH<3> is asserted high, then CARRY<3> will be asserted high and P<3> will discharge regardless of the other MATCH signals. The other three CARRY<2:0> outputs will be inhibited low as a result of P<3> being discharged.

If MATCH<3> does not discharge P<3>, it will also not pass the match to the next encoder circuit and CARRY <3> will be inhibited low. If MATCH<2> is asserted high then P<2> will be discharged. CARRY<2> will be asserted high as P<3> remains charged and MATCH<2> is asserted high. Again, in this case, the lower priority MATCH signals do not matter with respect to CARRY <2>.

If MATCH<3:2> does not discharge P<3:2>, then it will not pass the match to the next encoder and CARRY<3:2> will be inhibited low. If MATCH<0> is asserted high then P<0> will be discharged. CARRY<0> will be asserted high as P<3:1> remain charged and MATCH<0> is asserted high. The bus P<0> is not required because P<3:1> are not discharged and the only option left is the bottom lowest priority, subject to some exceptions as explained below.

It should be understood that the circuit cascading can work in two dimensions. FIG. 2 shows the 4-bit priority encoder circuit that can be used with the present invention. If a 4-bit encoder is required, then two 2-bit encoder circuits as described above can be cascaded horizontally as illustrated by the two cascaded circuits 50, 52. With four bits, there would be 16 as illustrated. For example, four pairs of cascaded encoder circuits can be stacked vertically and the P<3:0> buses are connected between all four pairs, forming the 16 match lines and circuit block functions as illustrated. The result is 16 MATCH signals as inputs, with 16 CARRY signals between pairs as best illustrated in FIG. 2.

Figure 5:
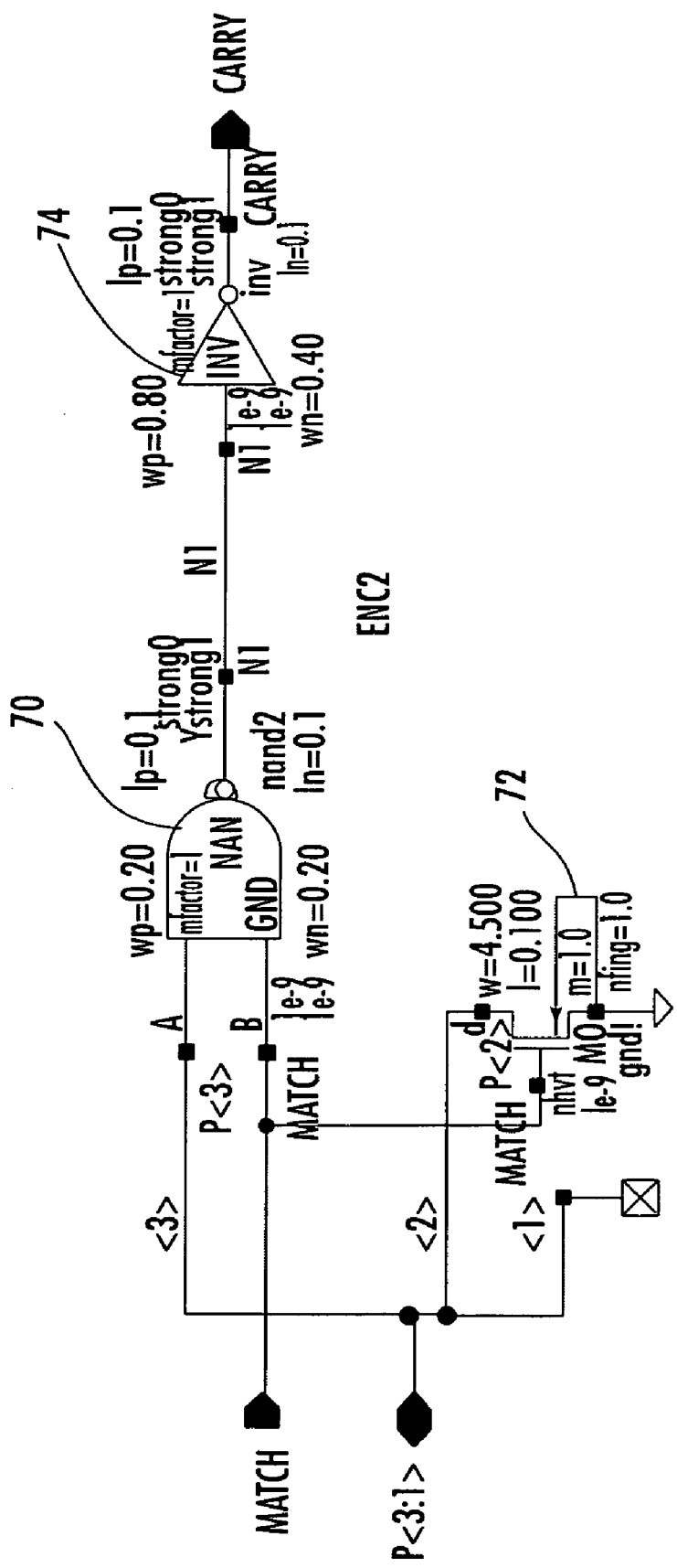
Figure 6:
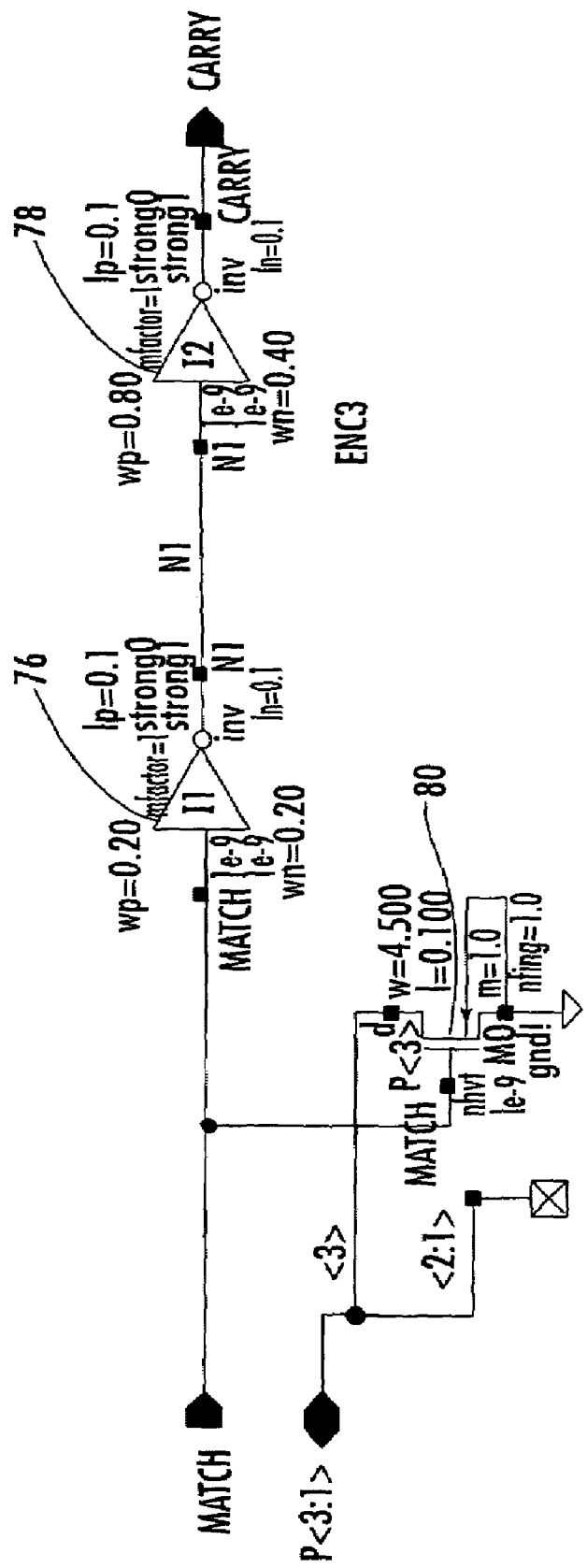
Figure 7:
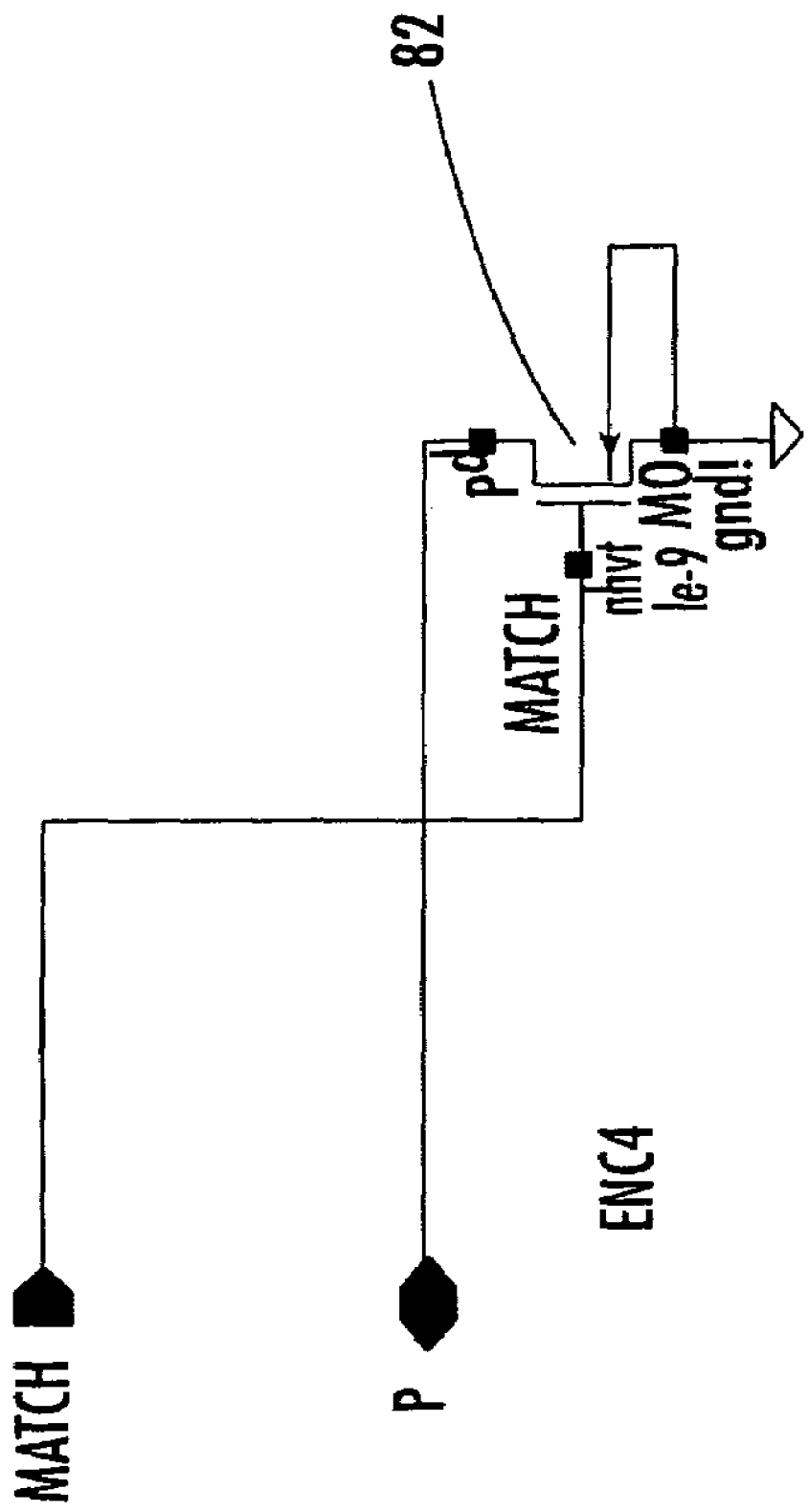

FIGS. 3–7 are schematic circuit diagrams that illustrate how each 2-bit encoder circuit section can be assembled to make a 4-bit encoder of the present invention. The lowest priority corresponds to FIG. 3, with increasing priority for FIGS. 4–6 as illustrated. FIG. 7 shows a circuit used for least significant 2-bit encoder blocks only.

Figure 3:
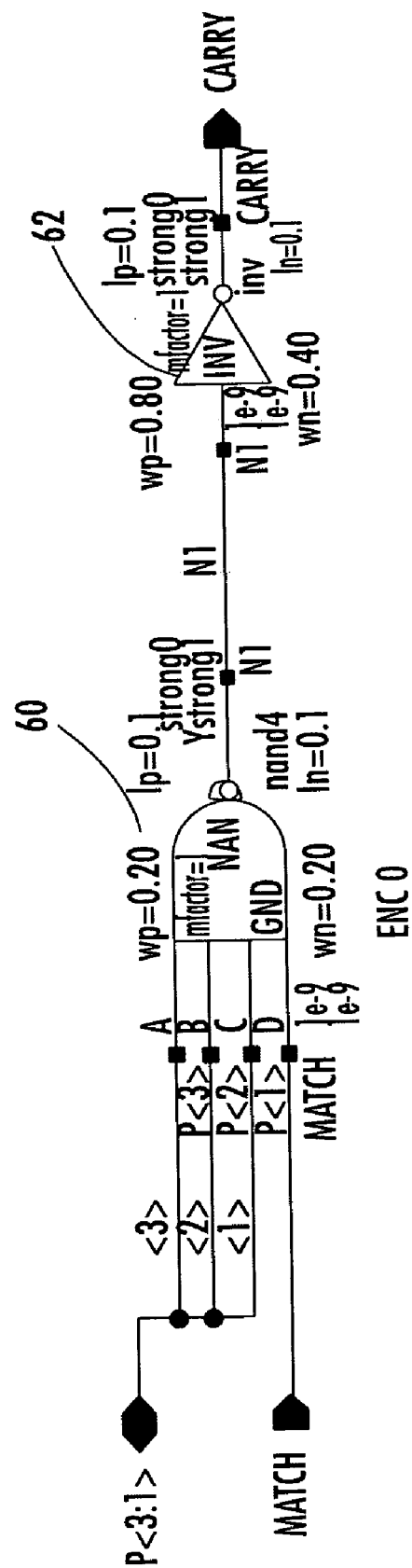
FIGS. 3–7 are schematic circuit diagrams illustrating the different sections of the 2-bit encoder circuit that are assembled to make a 4-bit encoder in accordance with one example of the present invention such as shown in FIG. 2.
Figure 4:
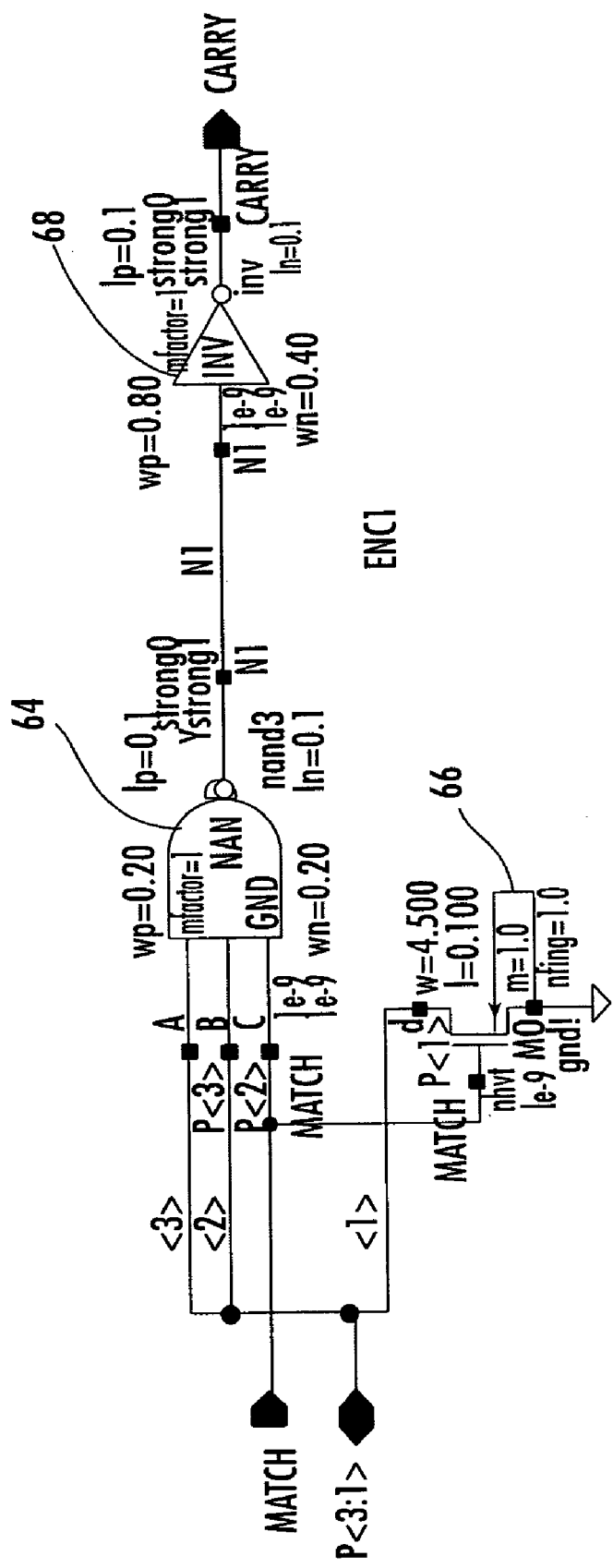

FIG. 3 shows a NAND gate 60 connected to an inverter gate 62. FIG. 4 shows a NAND gate 64 operative with a transistor 66 and connected to an inverter circuit 68. FIG. 5 is similar to FIG. 4 and illustrates a NAND gate 70 operative with a transistor 72 and inverter circuit 74. FIG. 6 shows two inverter circuits 76, 78 connected serially to each other with the first inverter circuit 76 operative at its input with a transistor 80. FIG. 7 illustrates a transistor circuit 82 alone for a respective match as illustrated. These FIGS. 3–7 correspond to functional circuits shown in FIG. 1 in operation.

As to the joining of P buses, the functionality in the circuit works the same with four vertically cascaded encoders as it does with a single 2-bit encoder. Any row can discharge the P bus that it is connected through the n-channel transistor. In any given 4×4 encoder block, a match may occur, but it is not carried through due to a higher priority discharge in another 4×4 block.

Referring again to FIG. 2, it is evident that there is no carry from a 4 block group positioned to the right, i.e., the least significant of the 2-bit encoders because there is no subsequent encoder to carry on. The cascading can continue to accommodate as many addressed bits as necessary by inserting 2-bit encoders in front of existing cascaded circuits. There would be a limit in some designs, however, of how many cascaded circuits both horizontally and vertically can be sustained. Propagation delays and P bus loading will dictate the limit based on performance requirements.

Figure 8:
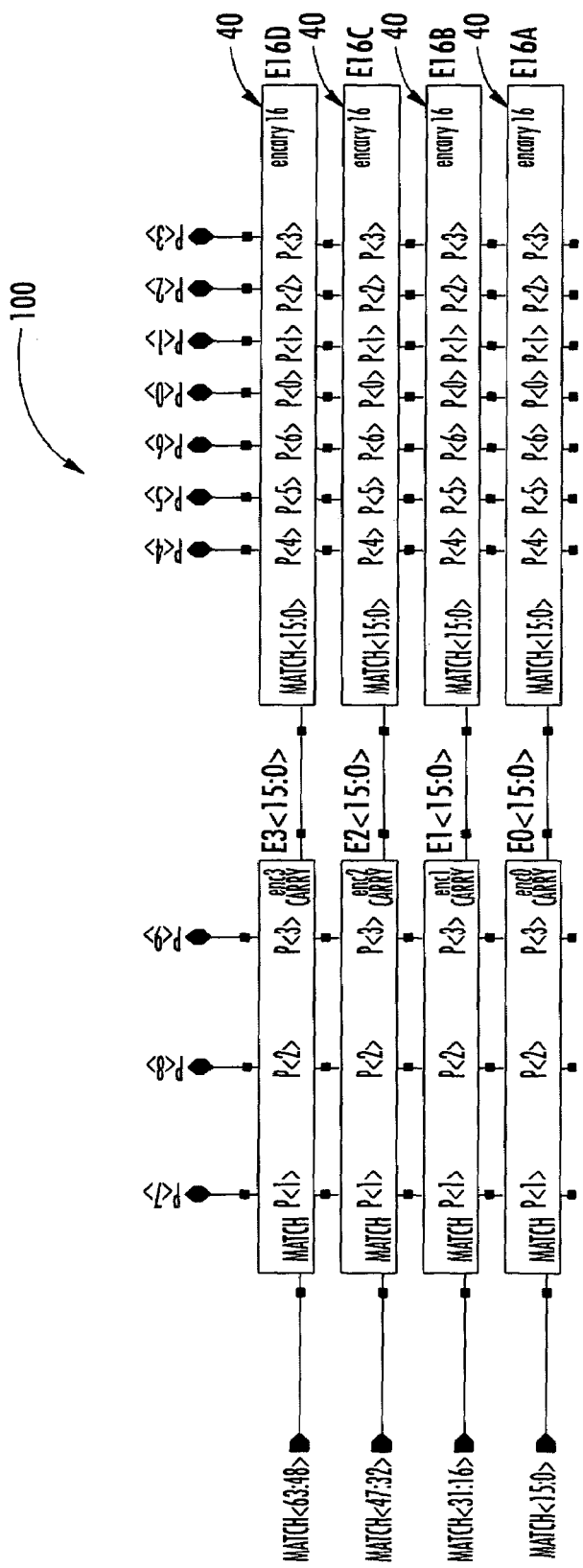
FIG. 8 is an expanded block diagram of a 6-bit priority encoder in accordance with another example of the present invention.
Figure 9:
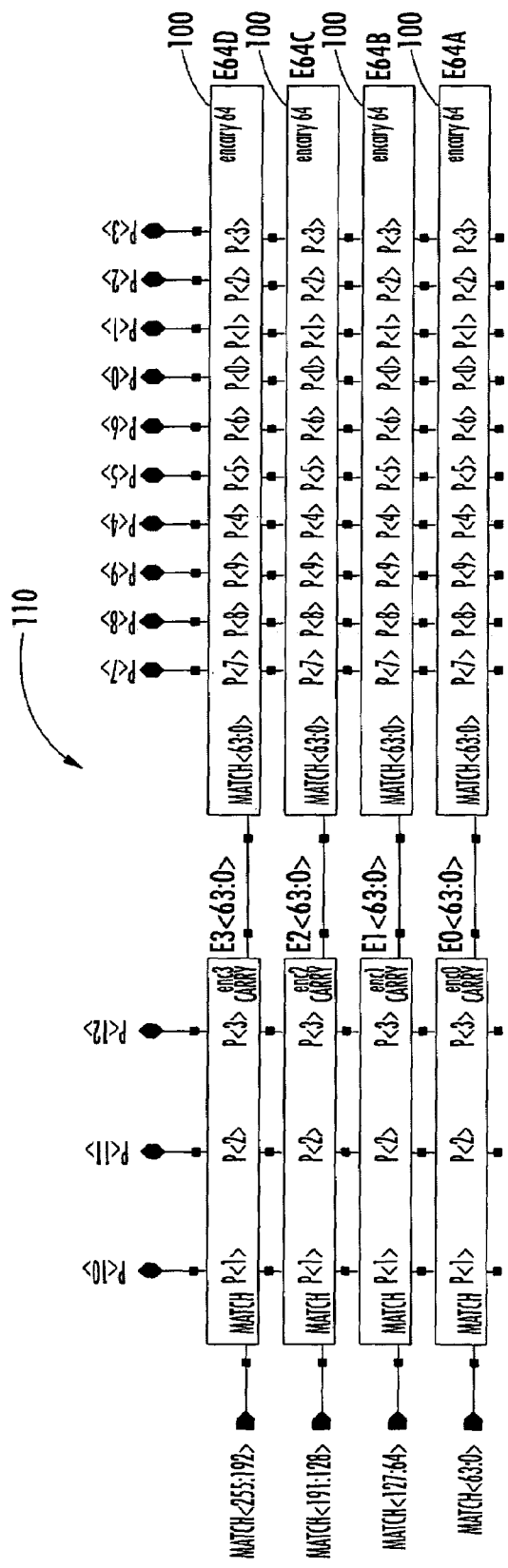
FIG. 9 is an expanded block diagram of an 8-bit priority encoder in accordance with another example of the present invention.
Figure 10:
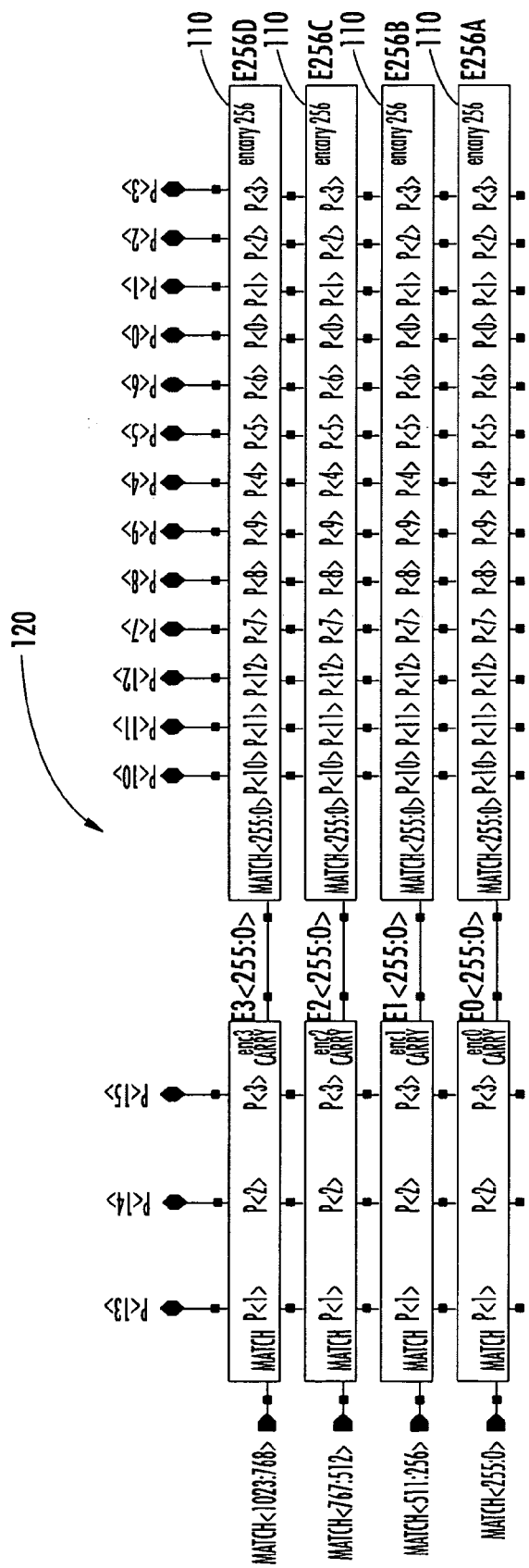
FIG. 10 is an expanded block diagram of a 10-bit priority encoder in accordance with another example of the present invention.
Figure 10A:
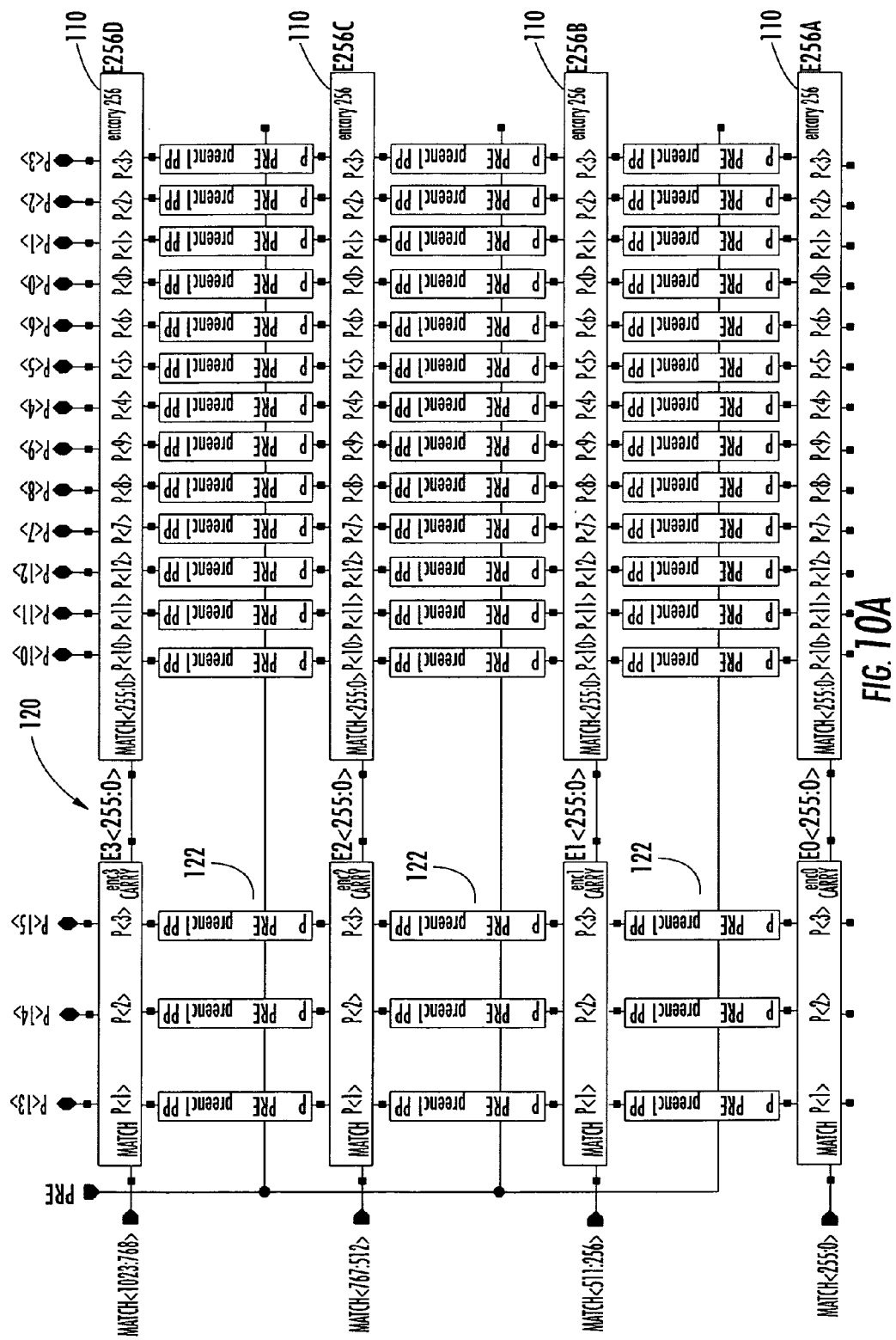
FIG. 10A is an expanded block diagram of the 10-bit priority encoder similar to that shown in FIG. 10, but showing added buffering circuits.

It has been found that up to 10 (ten) bits and 1024 rows can be generated. For this example, 5 (five) horizontally cascaded blocks and 256 vertically cascaded blocks can be used to complete the priority encoder. FIGS. 8, 9 and 10 are block circuit diagrams of an arrayed encoder, and show a respective 6-bit Priority Encoder 100 in FIG. 8, an 8-bit Priority Encoder 110 in FIG. 9, and a 10-bit Priority Encoder 120 in FIG. 10 to complete an example of the arrayed encoder of the present invention. With each additional two bits a successive, most significant bit pair can be inserted in front of the existing cascaded circuit. FIG. 10A includes added buffering circuits 122.

Figure 11:
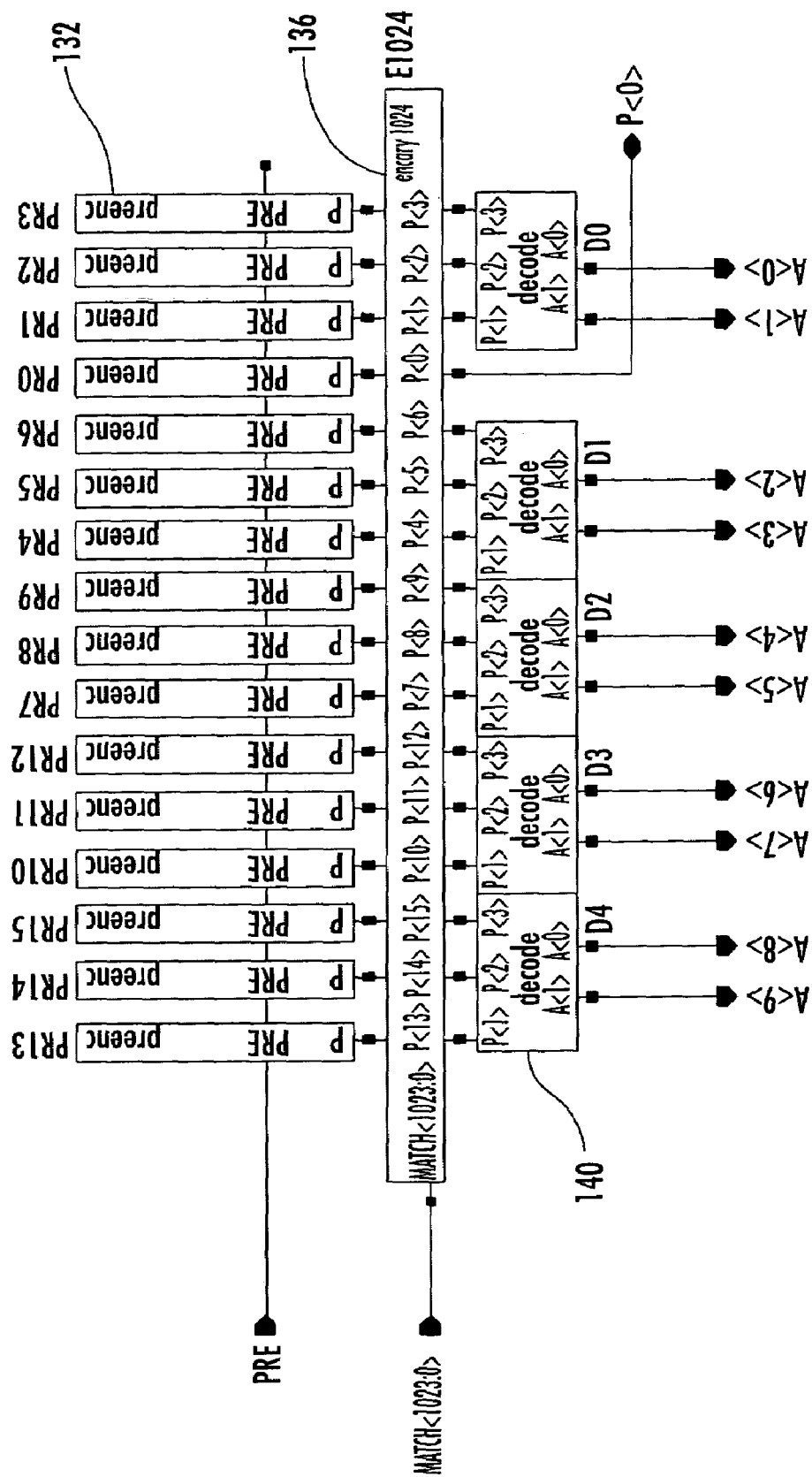
FIG. 11 is an expanded block diagram of a physical priority encoder with arrayed blocks to provide a P bus that is precharged and convert the P bus priorities to a usable binary address in accordance with the present invention.

FIG. 11 is an example of a block circuit diagram of the 10-bit physical priority encoder 120, and showing greater details of prematched bus circuits 132, the match line circuits 136 and decode circuits 140. As noted before P<0> can be used to determine there was no match, since it is the lowest priority. As the encoder processes and no matches occur on other P match lines, P<0> is last. If matches occur on other lines, P<0> is not necessary.

Figure 12:
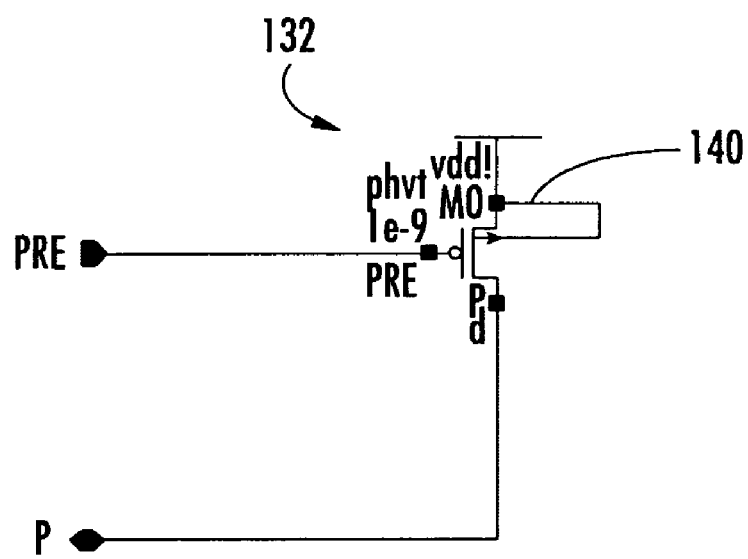
FIG. 12 is a schematic circuit diagram of a precharged bus circuit in accordance with the present invention.
Figure 12A:
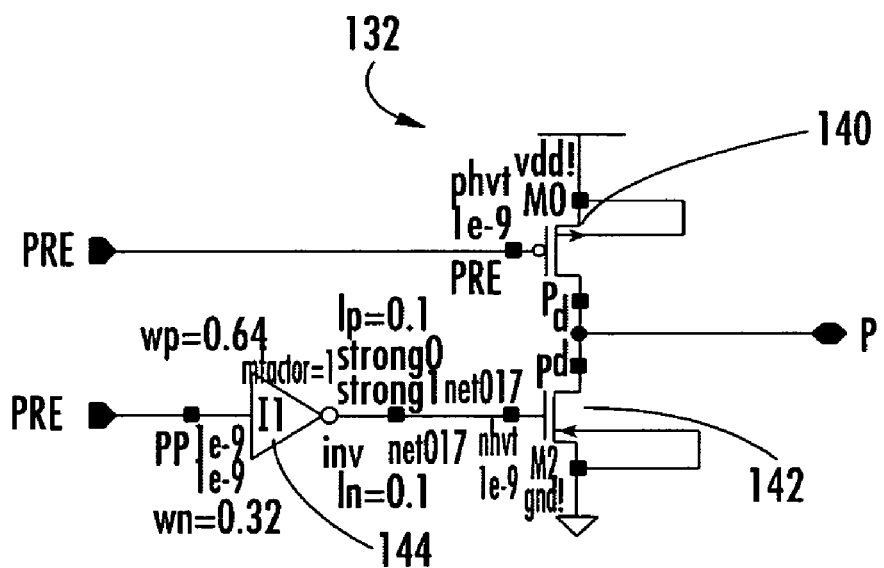
FIG. 12A is another schematic circuit diagram of a precharged bus circuit similar to that shown in FIG. 12 but with an added buffer circuit.

An example of a single priority precharge circuit 132 for the priority encoder of the present invention is shown in FIG. 12. A P-channel transistor 140 in this non-limiting example pulls up the P buses to VDD at the beginning of an encoder cycle. FIG. 12A shows a similar schematic circuit diagram where an additional transistor 142 and inverter circuit 144 are added for buffering capability.

Figure 13:
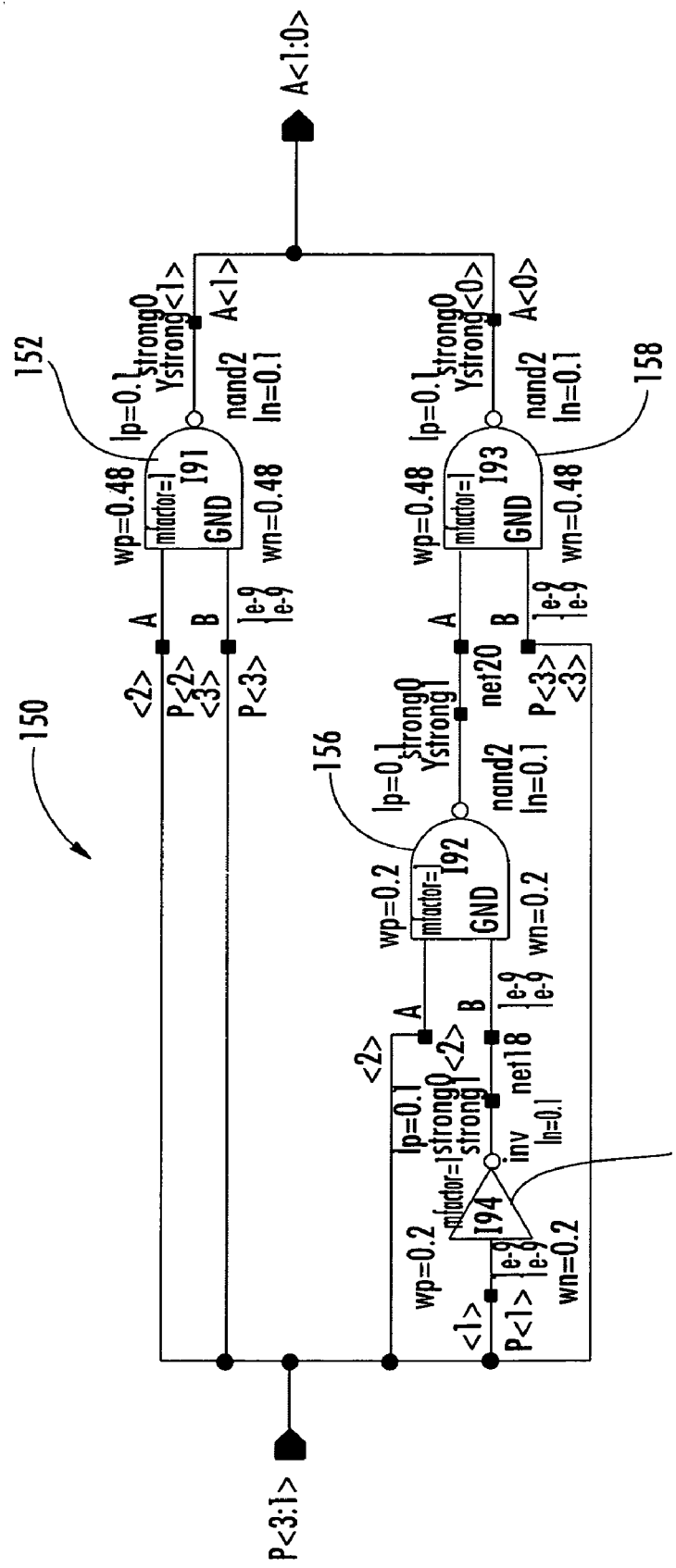
FIG. 13 is a schematic circuit diagram of an address converter that can be used in accordance with the present invention.

An address conversion can be accomplished on each 2-bit encoder using a logic circuit 150 such as illustrated in the schematic circuit diagram shown in FIG. 13. This circuit includes an upper NAND gate 152 and a serially connected inverter circuit 154, NAND gate 156 and second NAND gate 158, forming dual NAND gates. P<3:1> are input to the upper NAND gate and the lower inverter circuit and dual NAND gate, as illustrated. Based on the highest discharge P bus, the binary address is logically determined. The P<0> bus is not used in the decoder. If the upper three P buses remain charged, it can be assumed that the 2-bit address is 0, 0.

In some cases, if no match occurs, than all P buses will remain charged and the address will be all zeros. There should be no address when no match occurs. In this case, the P<0> bus of the least significant 2-bit encoder is used to determine if it is discharged. If not, then no match occurred.

Many modifications and other embodiments of the invention will come to the mind of one skilled in the art having the benefit of the teachings presented in the foregoing descriptions and the associated drawings. Therefore, it is understood that the invention is not to be limited to the specific embodiments disclosed, and that modifications and embodiments are intended to be included within the scope of the appended claims.

That which is claimed is:

1. A Content Addressable Memory (CAM) device comprising:
    an array of CAM cells arranged in columns and rows, with each row operative to produce a match signal indicative that compare data has matched data within the respective row; and
    a priority encoder operatively connected to the array of CAM cells for determining a highest priority matching address for data within the array of CAM cells, said priority encoder including match lines associated with respective rows, and precharged bus lines connected into respective match lines that are discharged whenever there is a match signal such that the highest precharged bus line as the precharged bus line that is connected to the match line with the highest matching address priority that has been discharged results in an encoded address.

2. A CAM device according to claim 1 wherein said priority encoder comprises a plurality of n-bit encoder circuits that are cascaded together to accommodate the number of addressed bits as necessary for the array of CAM cells.

3. A CAM device according to claim 2 wherein carry signals on a most significant n-bit encoder circuit feed match lines on less significant n-bit encoder circuits that are cascaded together.

4. A CAM device according to claim 2 wherein each n-bit encoder circuit feeding a cascaded n-bit encoder circuit includes a logic circuit for inhibiting a carry operation or allowing a carry operation to the next cascaded encoder circuit.

5. A CAM device according to claim 4 wherein said logic circuit comprises a second logic component and inverter circuit coupled to the second logic component.

6. A CAM device according to claim 5 wherein said second logic component comprises an inverter or NAND gate.

7. A CAM device according to claim 2 wherein each n-bit encoder circuit comprises a 2-bit encoder circuit having four rows.

8. A CAM device according to claim 1 wherein precharged bus lines are charged high at the beginning of an encoding cycle.

9. A CAM device according to claim 1 wherein each match line includes a pull-down transistor that discharges a precharged bus line when a match signal on a match line is high.

10. A CAM device according to claim 9 wherein each pull-down transistor comprises a gate connected to a respective match line, a source connected to ground, and a drain connected to a respective precharged bus line.

11. A CAM device according to claim 1 wherein said match lines are ordered in priority of bit addresses with most significant bit addresses followed by least significant bit addresses.

12. A CAM device according to claim 1 and further comprising a precharge circuit operatively connected to said precharged bus lines for charging the precharged bus lines high at the beginning of an encoding cycle.

13. A CAM device according to claim 12 wherein said precharge circuit comprises a transistor that pulls each precharged bus line to VDD at the beginning of an encoding cycle.

14. A Content-Addressable Memory (CAM) device comprising:
    an array of CAM cells arranged in columns and rows, with each row operative to produce a match signal indicative that compare data has matched data within the respective row; and
    a plurality of n-bit encoder circuits that are cascaded together to form a priority encoder operatively connected to the array of CAM cells for determining a highest priority matching address for data within the array of CAM cells, each n-bit encoder circuit having match lines associated with respective rows, and precharged bus lines connected into respective match lines that are discharged whenever there is a match signal, wherein the highest precharged bus line as the precharged bus line that is connected to the match line with the highest matching address priority that has been discharged indicates an n-bit address, and a logic circuit associated with each n-bit encoder for inhibiting or allowing a carry to a successive cascaded n-bit encoder circuit, wherein each n-bit encoder circuit feeds a less significant cascaded n-bit encoder circuit, and an address converter associated with each n-bit encoder circuit for determining an n-bit address for a respective n-bit encoder wherein the total n-bit address from the associated address converters indicates the address priority.

15. A CAM device according to claim 14 wherein carry signals on a most significant n-bit encoder circuit feed match lines on less significant n-bit encoder circuits.

16. A CAM device according to claim 14 wherein said logic circuit comprises a second logic component and an inverter circuit coupled to the second logic component.

17. A CAM device according to claim 16 wherein said second logic component comprises an inverter or NAND gate.

18. A CAM device according to claim 14 wherein each n-bit encoder circuit comprises a 2-bit encoder circuit having four rows.

19. A CAM device according to claim 14 wherein precharged bus lines are charged high at the beginning of an encoding cycle.

20. A CAM device according to claim 14 wherein each match line includes a pull-down transistor that discharges a precharged bus line when a match signal on a match line is high.

21. A CAM device according to claim 20 wherein each pull-down transistor comprises a gate connected to a respective match line, a source connected to ground, and a drain connected to a respective precharged bus line.

22. A CAM device according to claim 14 wherein said match lines within each n-bit encoder circuit are ordered in priority of bit addresses with most significant bit addresses followed by least significant bit addresses.

23. A CAM device according to claim 14 and further comprising a precharged bus circuit operatively connected to said precharged bus lines of each n-bit encoder circuit for charging the precharged bus lines high at the beginning of an encoding cycle.

24. A CAM device according to claim 23 wherein said precharged bus circuit comprises a transistor that pulls each precharged bus line to VDD at the beginning of an encoding cycle.

25. A priority encoder for use with a device having a plurality of arrayed objects to be encoded in binary and arranged in rows and columns, comprising:
a plurality of match lines adapted to be connected to the plurality of arrayed objects associated with respective rows, and precharged bus lines connected into respective match lines that are discharged whenever there is a match signal produced such that the highest precharged bus line as the precharged bus line that is connected to the match line with the highest matching address priority that has been discharged results in an encoded address.

26. A priority encoder according to claim 25 and further comprising a plurality of n-bit encoder circuits that are cascaded together.

27. A priority encoder according to claim 25 wherein carry signals on a most significant n-bit encoder circuit feed match lines on less significant n-bit encoder circuits.

28. A priority encoder according to claim 25 wherein each n-bit encoder circuit feeding a cascaded n-bit encoder circuit includes a logic circuit for inhibiting a carry operation or allowing a carry operation to the next cascaded encoder circuit.

29. A priority encoder according to claim 25 wherein all precharged bus lines are charged high at the beginning of an encoding cycle.

30. A priority encoder according to claim 25 wherein each match line includes a pull-down transistor that discharges a precharged bus line when a match signal on a match line is high.

31. A priority encoder according to claim 25 wherein said match lines are ordered in priority of bit addresses with the most significant bit addresses followed by least significant bit addresses.

32. A priority encoder according to claim 25 and further comprising a precharge circuit operatively connected to said precharged bus lines for charging the precharged bus lines high at the beginning of an encoding cycle.

* * * * *